United States Patent [19]

Kwon et al.

[11] Patent Number: 5,721,750
[45] Date of Patent: Feb. 24, 1998

[54] LASER DIODE FOR OPTOELECTRONIC INTEGRATED CIRCUIT AND A PROCESS FOR PREPARING THE SAME

[75] Inventors: Young-Se Kwon, Taejon; Jeong-Keun Ji, Seoul, both of Rep. of Korea

[73] Assignee: Korea Advanced Institute of Science and Technology, Taejon, Rep. of Korea

[21] Appl. No.: 631,773

[22] Filed: Apr. 12, 1996

[30] Foreign Application Priority Data

Apr. 13, 1995 [KR] Rep. of Korea .................. 1995-8647

[51] Int. Cl.$^6$ .............................. H01S 3/19; H01L 21/20
[52] U.S. Cl. ................. 372/44; 372/43; 372/50; 372/45; 437/129
[58] Field of Search ............................ 372/43, 44, 50, 372/45; 437/129

[56] References Cited

U.S. PATENT DOCUMENTS

| | | | |
|---|---|---|---|
| 4,216,485 | 8/1980 | Page | 372/50 X |
| 4,578,793 | 3/1986 | Kane et al. | 372/94 |
| 4,720,468 | 1/1988 | Menigaux et al. | 437/129 |
| 4,894,840 | 1/1990 | Liau et al. | 372/108 |
| 4,924,476 | 5/1990 | Behfar-Rad et al. | 372/94 |
| 5,291,057 | 3/1994 | Moon | 372/50 X |
| 5,365,537 | 11/1994 | Sato et al. | 372/50 |
| 5,373,173 | 12/1994 | Ohata et al. | 372/50 X |
| 5,479,426 | 12/1995 | Nakanishi et al. | 372/43 |

OTHER PUBLICATIONS

Jonhnson et al., CW Operation of Folded–Cavity Semiconductor Lasers with Etched Turning Mirrors, Elec. Lett., 28 (21): 2025–2026 (1992).

Chae et al., GaAs/AlGaAs Rooftop Reflector Laser for Optoelectronic Integrated Circuits, Elec. Lett., 23 (21): 1119–1120 (1987).

Smith et al., Optical Properties of Reactive Ion Etched Corner Reflector Strained–Layer InGaAs–GaAs–AlGaAs Quantum–Well Lasers IEEE Photonics Tech. Lett., 5(8): 873–876 (1993).

Hurwitz et al., Integrated GaAs–AlGaAs Double–Heterostructure Lasers, Appl. Phys. Lett., 27(4): 241–243 (1975).

Utaka et al., Lasing Characteristics of 1.5–1.6 μm GaInAsP/InP Integrated Twin–Guide Lasers with First–Order Distributed Bragg Reflectors, IEEE J. of Quantum Elec., 17(5): 651–658 (1981).

Aiki et al., Frequency Multiplexing Light Source with Monolithically Integrated Distributed–Feedback Diode Lasers Appl. Phys. Lett., 29(8): 506–508 (1976).

(List continued on next page.)

*Primary Examiner*—Brian Healy
*Attorney, Agent, or Firm*—Jacobson, Price, Holman & Stern, PLLC

[57] ABSTRACT

The present invention relates to a laser diode for optoelectronic integrated circuit, more specifically, to a laser diode for optoelectronic integrated circuit with a rooftop reflector which can be operated by means of a low driving current and a process for preparing the same. A laser diode for optoelectronic integrated circuit of the present invention comprises: a substrate; a waveguide consisting of a N-cladding layer and a passive waveguide layer, which is positioned on the substrate; an active waveguide with a rooftop reflector, which is positioned on the waveguide and has an epitaxial layer of a separating layer, an active layer, a P-cladding layer and a p-ohmic layer; $SiO_2$ layer with a linear contact opening which is positioned on the active waveguide; an upper metal contact layer which is positioned on the $SiO_2$ layer; and, a lower metal contact layer which is positioned under the substrate. The laser diode for optoelectronic integrated circuit of the present invention has a high efficiency of utilization of light and a low threshold current, to make the laser diode operational by means of a low driving current.

2 Claims, 7 Drawing Sheets

OTHER PUBLICATIONS

Abe et al., GaInAsP/InP Integrated Laser with Butt-Jointed Built-in Distributed-Bragg-Reflection Waveguide, Elec. Lett., 945-947 (1981).

Vawter et al., Monolithically Integrated Transverse-Junction-Stripe Laser with an External Waveguide in GaAs/AlGaAs, IEEE J. of Quantum Elec., 25(2): 154-162 (1989).

Wright et al., Monolithic Integration of InGaAsP Heterostructure Lasers and Electrooptical Devices, IEEE J. of Quantum Elec., QE-18 (2): 249-258 (1982).

Ribot et al., Improved Design for the Monolithic Integration of a Laser and an Optical Waveguide Coupled by an Evanescent Field, IEEE J. of Quantum Elec., 26(11): 1930-1941 (1990).

Merz et al., GaAs Integrated Optical Circuits by Wet Chemical Etching, IEEE J. of Quantum Elec., QE-15 (2): 72-82 (1979).

Kishino et al., Monolithic Integration of Laser and Amplifier/Detector by Twin-Guide Structure, Japan. J. of Appl. Phys., 17(3): 589-590 (1978).

Campbell et al., Monolithic Laser/Waveguide Coupling by Evanescent Fields, IEEE J. of Quantum Elec., QE-13(4): 253-255 (1977).

Suematsu et al., Axial-Mode Selectivities for Various Types of Integrated Twin-Guide Lasers, IEEE J. of Quantum Elec., QE-13(8): 619-622 (1977).

Suematsu et al., Integrated Twin-Guide AlGaAs Laser with Multiheterostructure, IEEE J. of Quantum Elec., QE-11(7): 457-459 (1975).

Hagberg et al., Single-Ended Output GaAs/AlGaAs Single Quantum Well Laser with a Dry-etched Corner Reflector, Appl. Phys. Lett., 56(20): 1934-1936 (1990).

Jung et al., Nonlinear Quenching in a Monolithically Integrated Semiconductor Laser Logic Device, Japan. J. of Appl. Phys., 28(2): 1242-1245 (1989).

Smith et al., CW Operation of Corner Cavity Semiconductor Lasers, IEEE J. of Quantum Elec., 5(8): 876-879 (1993).

$\alpha + \beta = 90°$

LASER DIODE FOR OPTOELECTRONIC INTEGRATED CIRCUIT AND A PROCESS FOR PREPARING THE SAME

FIELD OF THE INVENTION

The present invention relates to a laser diode for optoelectronic integrated circuit, more specifically, to a laser diode for optoelectronic integrated circuit with a rooftop reflector which can be operated by means of a low driving current and a process for preparing the same.

BACKGROUND OF THE INVENTION

Optoelectronic integrated circuit which is prepared by the integration of a lot of optical and electronic devices on a substrate, has merits over the conventional circuits which are fabricated by the integration of individual devices manufactured separately, in light of the following points: it has a high circuit credibility; it can be reproduced in a small size; and, the expenses incurred in the integration of circuit can be cut down, owing to its high productivity. Further, it can be fabricated very easily without any assembly step which is required to connect optical devices each other, and it can be operated in a stable manner even under a hard swinging or bad environment. Accordingly, the optoelectronic integrated circuit has become the subject of increasing interest in the past years, due to its potential for higher performance systems.

To prepare the optoelectronic integrated circuit, is required a step of connecting a light emitting device such as laser diode(LD) or light emitting diode(LED) which plays a role as a luminous source, with an optical device such as photodetector, photoamplifier, photomodulator and the like, by the aid of one waveguide. Among the said devices, the laser diode requires a reflector on both sides of a resonator for optical feed-back, which is quietly distinct from other optical devices; and, therefore, it has been known that the step of connecting the laser diode with the waveguide is the most complicated and hard process. The conventional reflector for laser diode which is a light emitting device, in general, has been manufactured by cutting a substrate; the prior art, however, has revealed a serious problem that the devices can not be integrated on the optoelectronic integrated circuit in the course of connecting the laser diode with the waveguide.

Under the circumstances, to solve the problems caused by the characteristics of said laser diode and waveguide, a variety of approaches have been made, which comprises the structural change of the reflector for laser diode:

Vawter et al discloses a laser diode(11) which is integrated with a waveguide(12) vertically, as depicted in FIG. 1, to enable light from the laser diode to incident on the waveguide positioned under the laser diode(see: G. A. Vawter et al., IEEE J. Quan. Elec., 25:154(1989)).

The said laser diode(11) of prior art can be integrated with a waveguide(12) by one crystalline growth, to ease the manufacturing process; however, it has demerits of low efficiency of light utilization, grounded on the vertical positioning of the laser diode(11) and waveguide(12) against the direction of the light(13), so that the light comes through the laser diode and only a small portion of light emitted from the laser diode can be incident on the waveguide.

Hurwitz et al teaches a laser diode which is integrated with a waveguide horizontally, as depicted in FIG. 2. The laser diode has a structure in which all most of the light emitted from the laser diode(21) is transmitted to the waveguide(22), grounded that the light(23) emitted from the laser diode(21) is incident on the waveguide(22) in a direct manner(see: C. E. Hurwitz et al., Appl. Phys. Lett., 27:241 (1975)).

The said laser diode in which the laser diode(21) and the waveguide(22) are positioned horizontally against the direction of light(23), has an improved efficiency of light utilization, when compared with the laser diode which is positioned against the waveguide vertically; it, however, essentially entails a complicated manufacturing process and has low productivity thereof, since it requires at least two times of crystalline growth to integrate the laser diode(21) with the waveguide(22). Moreover, the prior art laser diode whose structure is of a high threshold current, has not been easily applied in the art, since a high driving current is essentially required in the operation of laser diode and the reflectivity on the interface is not good.

SUMMARY OF THE INVENTION

A primary object of the invention is, therefore, to provide a laser diode for optoelectronic integrated circuit which can be easily integrated and operated on the said circuit by means of a low driving current, due to its high efficiency of light utilization and low threshold current.

The other object of the invention is to provide a process for preparing the laser diode for optoelectronic integrated circuit in a simple and economical manner.

BRIEF DESCRIPTION OF THE DRAWINGS

The above object of the present invention will become apparent from the following descriptions given in conjunction with the accompanying drawings, in which.

DETAILED DESCRIPTION OF THE INVENTION

A laser diode for optoelectronic integrated circuit of the present invention comprises:

a substrate;

a waveguide consisting of a N-cladding layer and a passive waveguide layer, which is positioned on the substrate;

an active waveguide with a rooftop reflector, which is positioned on the waveguide and has an epitaxial layer of a separating layer, an active layer, a P-cladding layer and a p-ohmic layer;

$SiO_2$ layer with a linear contact opening which is positioned on the active waveguide;

an upper metal contact layer which is positioned on the $SiO_2$ layer; and, a lower metal contact layer which is positioned under the substrate.

A process for preparing the laser diode for optoelectronic integrated circuit of the invention comprises the steps of:

(i) formation of a twin waveguide by a serial epitaxial growth of a N-cladding layer, a passive waveguide layer, a separating layer, an active layer, a P-cladding layer and a p-ohmic layer on a substrate, by the deposition of $Al_xGa_{1-x}As$ with a different Al molarity, doping concentration, dopant, thickness and refractive index;

(ii) formation of photoresist pattern on the substrate with the twin waveguide, removal of the photoresist pattern after the evaporation of $SiO_2$ layer, so that $SiO_2$ layer with a linear contact opening is formed;

(iii) formation of an upper contact layer by the evaporation of metal on the $SiO_2$ layer with a linear contact opening;

(iv) formation of a rooftop reflector by the etching of the substrate with the upper contact layer to the upper surface of a passive waveguide layer; and, (v) formation of a lower contact layer by the selective etching of the lower surface of the substrate and evaporation of metal.

A preferred embodiment of the present invention is explained in detail with references on the accompanying drawings, which should not be taken to limit the scope of the present invention.

Figure 1:
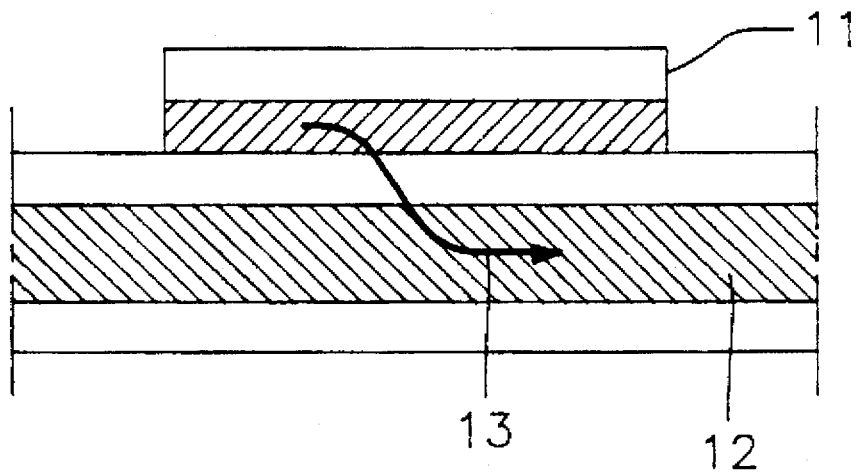
FIG. 1 is a schematic diagram showing a laser diode of prior art which is integrated with a waveguide vertically.
Figure 2:
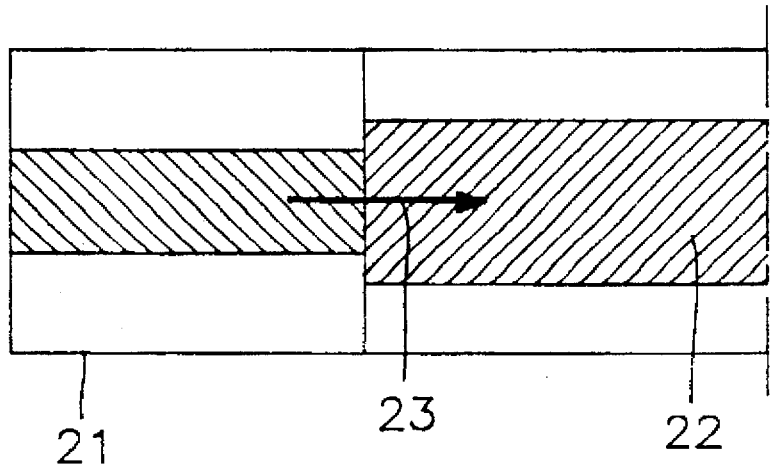
FIG. 2 is a schematic diagram showing a laser diode of prior art laser diode which is integrated with a waveguide horizontally.
Figure 3:
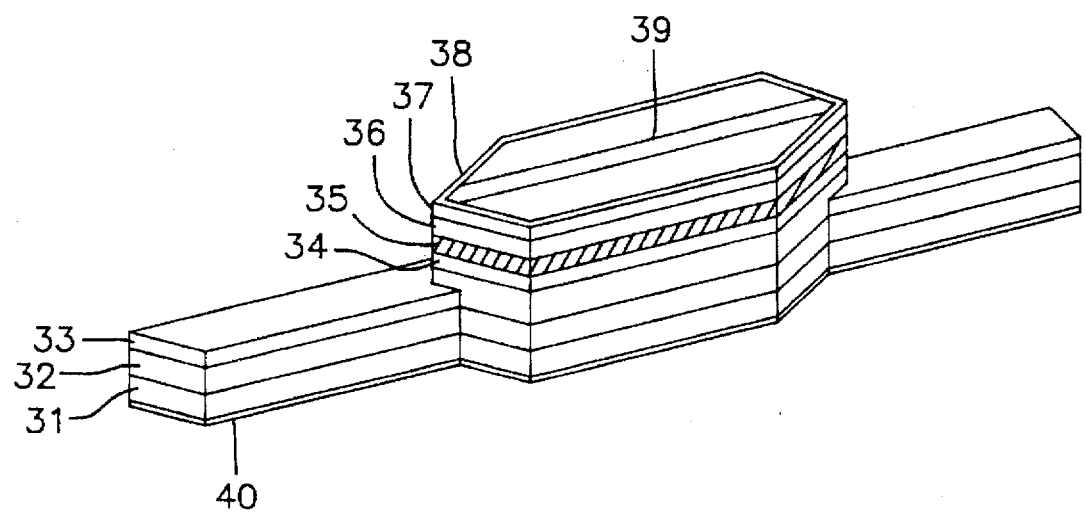
FIG. 3 is a perspective view showing a laser diode for optoelectronic integrated circuit which is formed on a waveguide.
Figure 4:
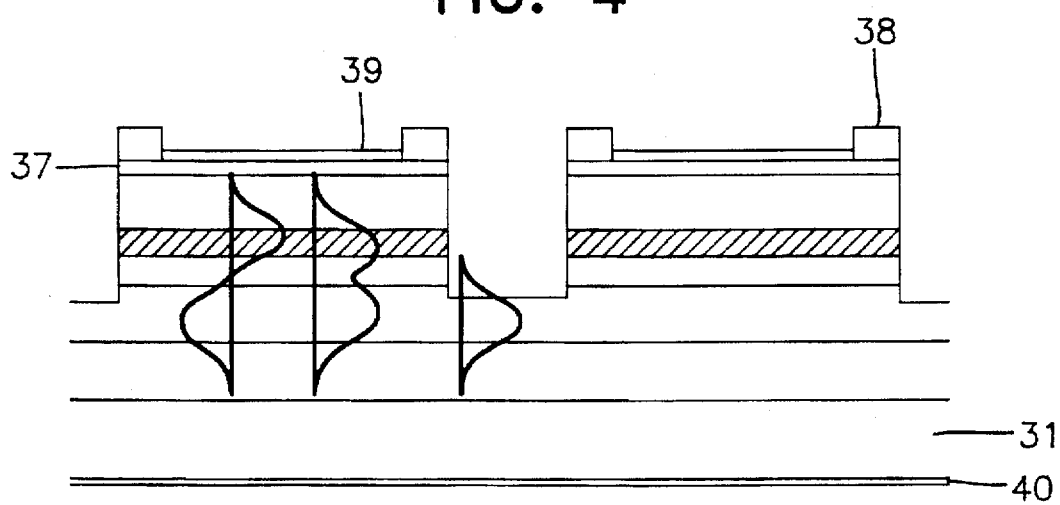
FIG. 4 is a cross-sectional view showing two laser diodes for optoelectronic integrated circuit which are linked with a waveguide.

FIGS. 3 and 4 are perspective and cross-sectional views showing laser diodes for optoelectronic integrated circuit which are linked with a waveguide, respectively.

Referring to FIGS. 3 and 4, the laser diode of the invention has a structure which comprises a substrate(31), a waveguide which consists of a N-cladding layer(32) and a passive waveguide layer(33) positioned on the substrate(31) and an active waveguide with a rooftop reflector on the waveguide. The active waveguide with a rooftop reflector has an epitaxial layer of a separating layer(34), an active layer(35), a P-cladding layer(36) and a p-ohmic layer(37), in which a linear contact opening is formed on the active waveguide and an upper metal contact(39) for applying current on the laser diode is formed on the contact in $SiO_2$ layer(38). Moreover, a lower metal contact(40) is formed under the substrate(31), to apply current on the laser diode, by the electrodes of the upper and lower metal contact(39, 40).

The process for fabricating the laser diode of the invention is described in detail.

Figure 5:
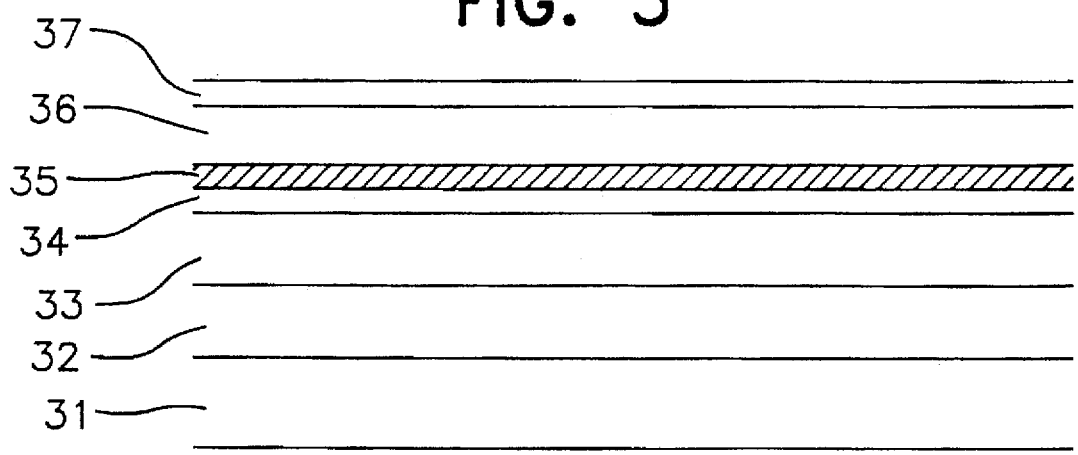
FIG. 5 is a cross-sectional view showing a substrate on which a twin waveguide is deposited.

FIG. 5 is a cross-sectional view showing a substrate on which a twin waveguide is deposited.

Referring to FIG. 5, a twin waveguide of the invention is formed to be active or passive, by depositing $Al_xGa_{1-x}As$ layer of a different Al molarity on a GaAs substrate(31): a $Al_xGa_{1-x}As$ layer which has a different Al molarity, dopant, doping concentration, thickness and refractive index, is deposited on the substrate(31), to form the twin waveguide by the epitaxial growth of a N-cladding layer(32), a passive waveguide layer(33), a separating layer(34), an active layer (35), a P-cladding layer(36) and a p-ohmic layer(37) in a serial manner.

Al molarity, dopant, doping concentration, thickness and refractive index which are preferably employed in the precess of the invention, are summarized in Table 1 below.

TABLE 1

| Name of Layer | Al Molarity | Dopant | Doping Concentration | Thickness | Refractive Index |
|---|---|---|---|---|---|
| p-ohmic layer | 0 | p | $2.5 \times 10^{18}$ | 0.1 | 3.71 |
| P-cladding layer | 0.3 | p | $5.0 \times 10^{17}$ | 1.0 | 3.41 |
| Active layer | 0 | — | — | 0.125 | 3.71 |
| Separating layer | 0.25 | n | $5.0 \times 10^{17}$ | 0.3 | 3.44 |
| Waveguide | 0.1 | n | $3.0 \times 10^{16}$ | 0.5 | 3.55 |
| N-Cladding layer | 0.3 | n | $5.0 \times 10^{17}$ | 1.0 | 3.41 |
| Substrate | 0 | n | $2.5 \times 10^{18}$ | — | 3.71 |

The Al molarity, dopant, doping concentration, thickness and refractive index disclosed in Table 1, are a preferred embodiment of the invention; and, therefore, they can be varied in the epitaxial growth of layers for the laser diode of the present invention.

Figure 6A:
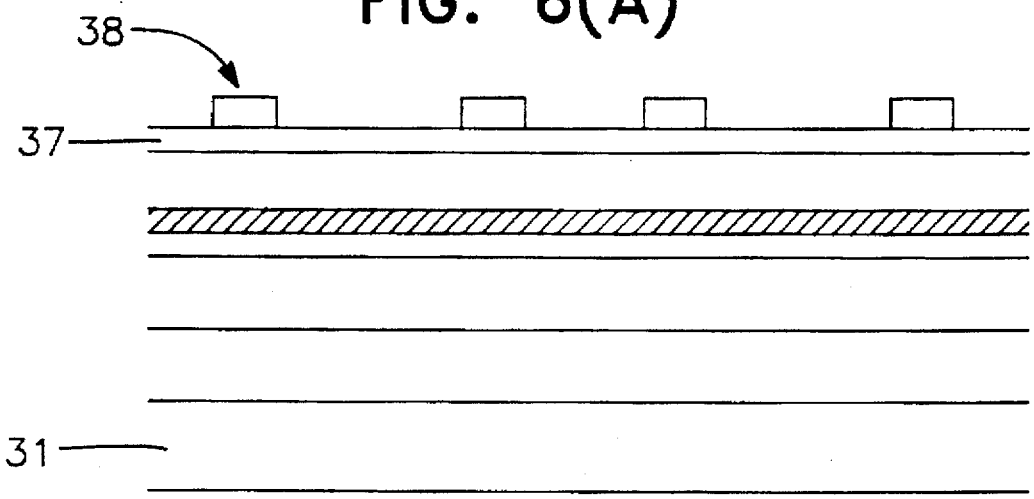
FIG. 6(A) is a cross-sectional view showing a substrate on which $SiO_2$ layer is formed.
Figure 6B:
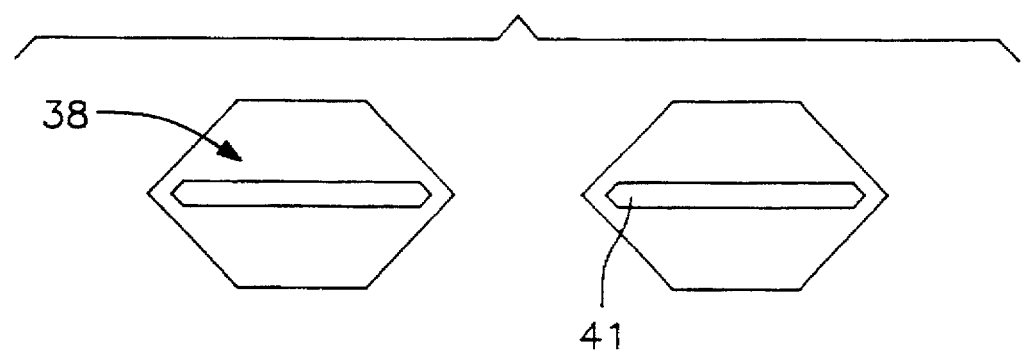
FIG. 6(B) is a planar view showing a substrate on which $SiO_2$ layer is formed.

After formation of a twin waveguide, a photoresist pattern is formed on the substrate with the twin waveguide. As shown in FIG. 6(A), $SiO_2$ layer(38) is evaporated on the photoresist pattern and the photoresist pattern is removed to give a linear contact opening, where the photoresist pattern is formed to have a structure which is opposite to that of $SiO_2$ layer(38) shown in FIG. 6(B). After the evaporation of $SiO_2$ layer(38) on the photoresist pattern, removal of the photoresist pattern employing organic solvents such as acetone is carried out to form $SiO_2$ layer(38) with a linear contact opening(41)(see: FIG. 6(B)). The substrate on which $SiO_2$ layer is formed by the said process, is depicted in FIGS. 6(A) and 6(B): FIG. 6(A) depicts a cross-sectional view showing a substrate on which $SiO_2$ layer is formed; and, FIG. 6(B) depicts a planar view showing a substrate on which $SiO_2$ layer is formed, where a band-shaped linear contact opening(41) is appeared on the center of the $SiO_2$ layer(38).

Figure 7A:
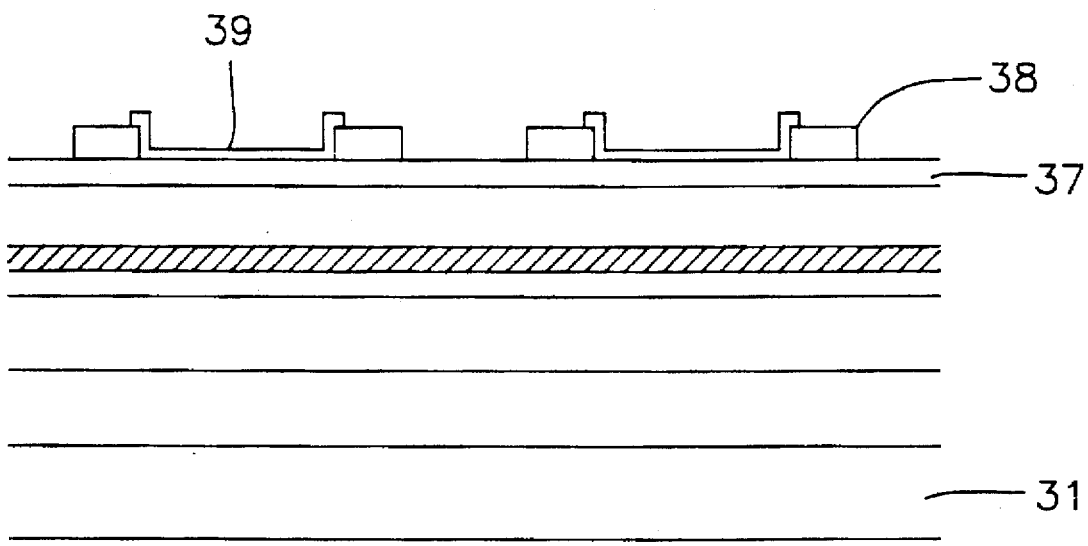
FIG. 7(A) is a cross-sectional view showing a substrate on which an upper contact is formed.
Figure 7B:
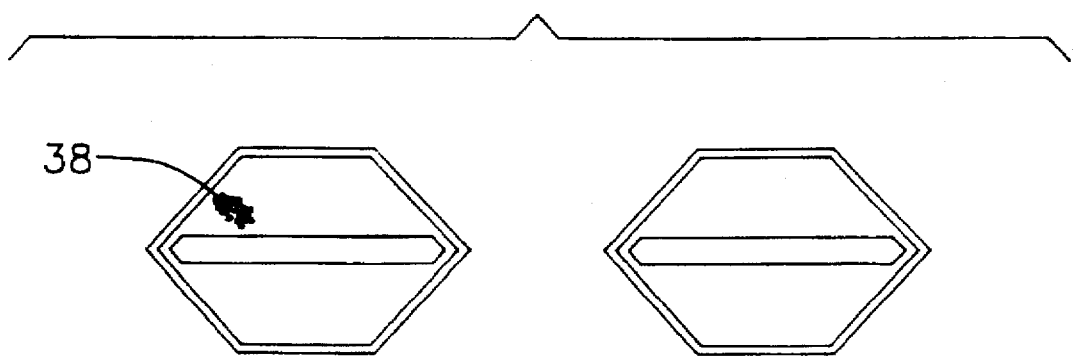
FIG. 7(B) is a planar view showing a substrate on which an upper contact is formed.

FIGS. 7(A) and 7(B) are cross-sectional and planar views showing a substrate on which an upper contact is formed, respectively. The upper contact(39) is formed by evaporating metals such as AuZn/Au on the $SiO_2$ layer(38). The evaporation of metal on the $SiO_2$ layer(38) eases current to be applied on the laser diode through the linear contact opening(41) which is formed on the $SiO_2$ layer(38).

Figure 8A:
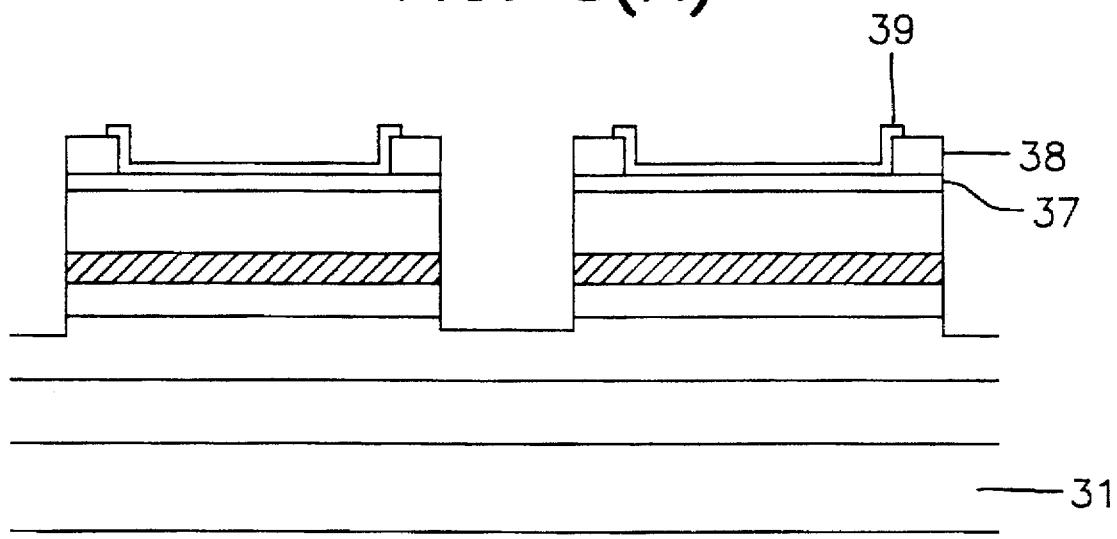
FIG. 8(A) is a cross-sectional view showing a substrate which is vertically etched.
Figure 8B:
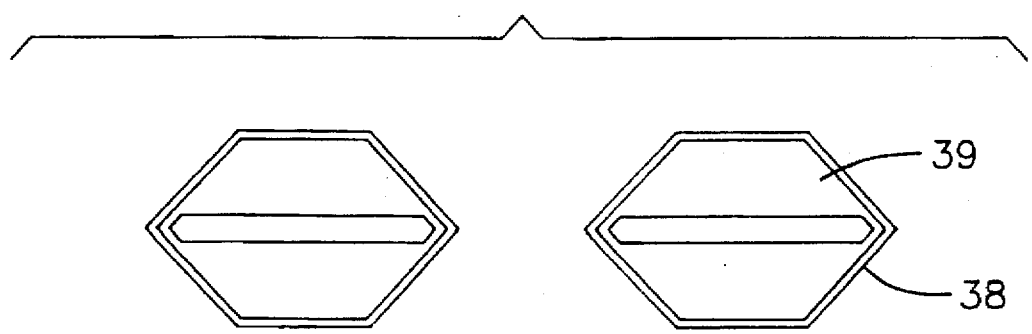
FIG. 8(B) is a planar view showing a substrate which is vertically etched.

A substrate on which an upper contact(39) is formed, is etched to the upper surface of a passive waveguide(33) vertically, to form a rooftop reflector, where $SiO_2$ layer(38) plays a role as a mask to perform a selective etching and, dried etching method is preferably employed in the vertical etching step. Cross-sectional view and planar view of a substrate which is vertically etched are shown in FIGS. 8(A) and 8(B), respectively.

Figure 9A:
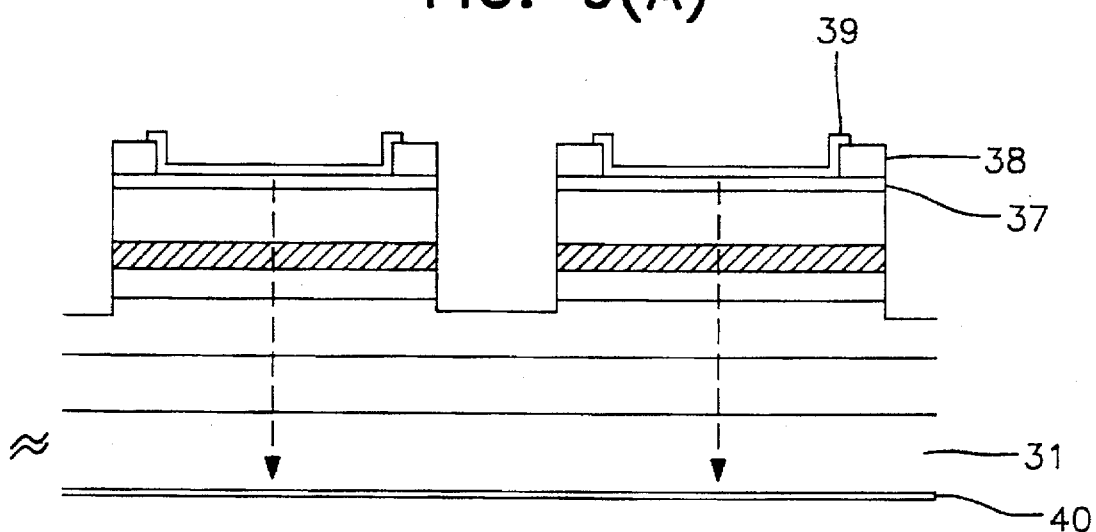
FIG. 9(A) is a cross-sectional view showing a substrate on which a lower contact is formed.
Figure 9B:
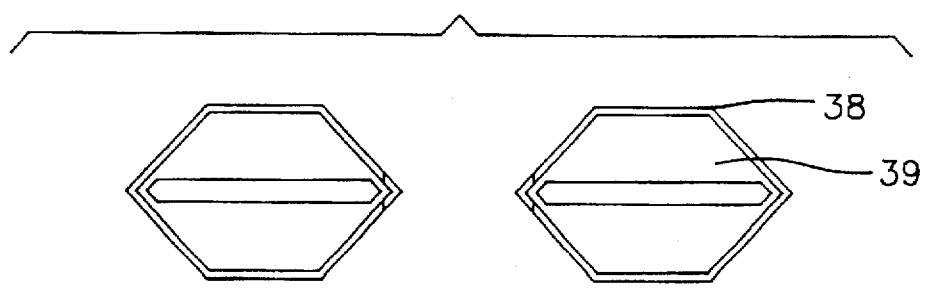
FIG. 9(B) is a planar view showing a substrate on which a lower contact is formed.

FIGS. 9(A) and 9(B) are cross-sectional view and planar view showing a substrate on which a lower contact is formed. Laser diode of the present invention is prepared by: etching of the upper surface of the substrate(31), selective etching of the lower surface of the substrate(31) to have a thickness of about 100 µm, and formation of a lower contact(40) on the lower surface by the evaporation of metals such as AuGe/Ni/Au.

In the process of preparing a waveguide for laser diode, a single waveguide can be fabricated by: selective etching of a substrate, formation of photoresist pattern on a rooftop reflector and a passive waveguide, wet-etching of the substrate employing a mixture of $H_2SO_4$, $H_2O_2$ and $H_2O$ ($H_2SO_4:H_2O_2:H_2O=1:8:1$, v/v), whereby etching of a passive waveguide layer except for band-shaped waveguide positioned on the laser diode is successfully performed.

The operation mode of the laser diode of the invention is described in more detail with references on the accompanying drawings.

Figure 10:
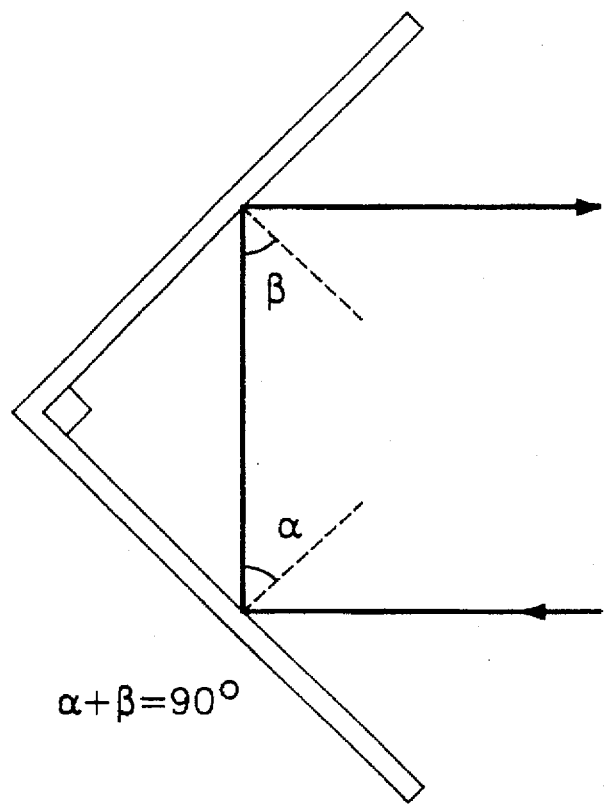
FIG. 10 is a schematic diagram depicting the reflection of light by a rooftop reflector which is formed on the laser diode of the invention.

A rooftop reflector of the laser diode consists of two smooth surfaces, each of which are of perpendicular position. As shown in FIG. 10, the inner part of the rooftop reflector is made of GaAs of a high refractive index so that light emitted from the laser diode is totally reflected by the rooftop reflector to protect the light from the incidence on the air.

Figure 11:
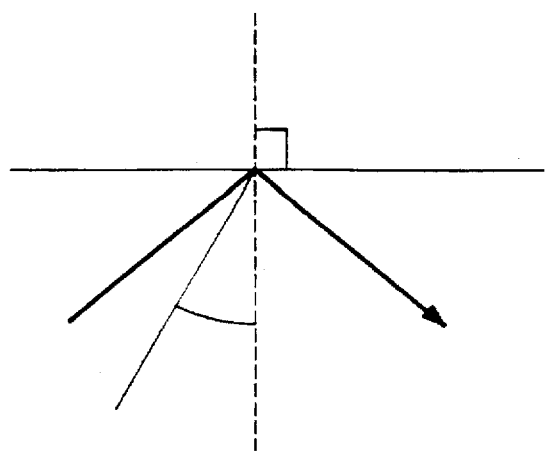
FIG. 11 is a reference diagram depicting the total reflection of light on a boundary plane of a mass which has a value of over critical angle.

FIG. 11 is a reference diagram showing a total reflection of light on a boundary plane of a mass which has a value of over critical angle. When light is incident on the boundary plane of a mass of different refractive indexes, the light progresses from a mass of a high refractive index to a low refractive index and the light of over critical angle is totally reflected.

In the laser diode of the invention, the reflectivity of the rooftop reflector is calculated as 100% theoretically, since a critical angle between GaAs and the air is 17°. Light of over 17° of incident angle is totally reflected to have a reflectivity of 100%. The laser diode of the invention has about three times of reflectivity, as much as the conventional laser diode with a linear-type reflector which has a reflectivity of 31%, which results in a heightened reflection of light to the laser diode, which makes,. in turn, the laser diode operational with a small gain. Accordingly, the laser diode for optoelectronic integrated circuit of the present invention has a low threshold current by the employment of the said rooftop reflector, to make the laser diode operational by means of a low driving current.

Moreover, the laser diode for optoelectronic integrated circuit of the present invention is constructed so that light emitted from the laser diode can be transmitted to other luminous devices, which eases a variety of devices such as a laser, a detector, a modulator and an amplifier to be integrated on a waveguide.

As clearly illustrated as aboves, the laser diode for optoelectronic integrated circuit of the present invention has a high efficiency of utilization of light and a low threshold current, to make the laser diode operational by means of a low driving current.

What is claimed is:

1. A laser diode for optoelectronic integrated circuit which comprises:

a substrate;

a waveguide consisting of a N-cladding layer and a passive waveguide layer, which is positioned on the substrate;

an active waveguide with a rooftop reflector, which is positioned on the passive waveguide layer and has an epitaxial layer of a separating layer, an active layer, a P-cladding layer and a p-ohmic layer;

$SiO_2$ layer with a linear contact opening which is positioned on the active waveguide;

an upper metal contact layer which is positioned on the $SiO_2$ layer; and, a lower metal contact layer which is positioned under the substrate.

2. A process for preparing the laser diode for an optoelectronic integrated circuit which comprises the steps of:

(i) formation of a twin waveguide by a serial epitaxial growth of a N-cladding layer, a passive waveguide layer, a separating layer, an active layer, a P-cladding layer and a p-ohmic layer on a substrate, by the deposition of $Al_xGa_{1-x}As$ with a different Al molarity, doping concentration, dopant, thickness and refractive index;

(ii) formation of photoresist pattern on the substrate with the twin waveguide, removal of the photoresist pattern after the evaporation of $SiO_2$ layer, so that $SiO_2$ layer with a linear contact opening is formed;

(iii) formation of an upper contact layer by the evaporation of metal on the $SiO_2$ layer with a linear contact opening;

(iv) formation of a rooftop reflector by the etching of the substrate with the upper contact layer to the upper surface of a passive waveguide layer; and, (v) formation of a lower contact layer by the selective etching of the lower surface of the substrate and evaporation of metal.

* * * * *